(12) United States Patent
Chou et al.

(10) Patent No.: US 11,356,115 B2
(45) Date of Patent: *Jun. 7, 2022

(54) LOOP GAIN AUTO CALIBRATION USING LOOP GAIN DETECTOR

(71) Applicant: Taiwan Semiconductor Manufacturing Company Limited, Hsinchu (TW)

(72) Inventors: Mao-Hsuan Chou, Hsinchu (TW); Ya-Tin Chang, Hsinchu (TW); Ruey-Bin Sheen, Taichung (TW); Chih-Hsien Chang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,585

(22) Filed: Dec. 4, 2020

(65) Prior Publication Data

US 2021/0250041 A1 Aug. 12, 2021

Related U.S. Application Data

(63) Continuation of application No. 16/785,869, filed on Feb. 10, 2020, now Pat. No. 10,868,562.

(51) Int. Cl.
*H03M 1/10* (2006.01)
*H03M 3/00* (2006.01)
(Continued)

(52) U.S. Cl.
CPC .......... *H03M 3/382* (2013.01); *G04F 10/005* (2013.01); *H03L 7/087* (2013.01); *H03M 3/458* (2013.01)

(58) Field of Classification Search
CPC ........ H03M 3/382; H03M 3/458; H03M 1/10; H03M 1/1009; H03M 2201/63;
(Continued)

(56) References Cited

U.S. PATENT DOCUMENTS 4,987,373 A * 1/1991 Soo ...................... H03D 13/004
327/145
6,275,555 B1 * 8/2001 Song ...................... H03L 7/0818
375/375

(Continued)

*Primary Examiner* — Jean B Jeanglaude
(74) *Attorney, Agent, or Firm* — Jones Day

(57) ABSTRACT

A device includes a phase detector circuit, a charge pump circuit, a sample and hold circuit, a comparator, and a controller. The phase detector circuit detects a clock skew between a reference signal and an input signal. The charge pump circuit translates the clock skew into a voltage. A sample and hold circuit samples the voltage, at a first time, and maintain the sampled voltage until a second time. The comparator (i) detects a loop gain associated with the input signal based on the sampled voltage and the voltage at the second time and (ii) outputs a loop gain signal for adjustment of the input signal. The controller is coupled to the phase detector, the comparator, and the sample and hold circuit. The controller generates a plurality of control signals for automatically controlling operation of the phase detector, the comparator, and the sample and hold circuit.

20 Claims, 12 Drawing Sheets

(51) Int. Cl.
  *G04F 10/00* (2006.01)
  *H03L 7/087* (2006.01)
(58) Field of Classification Search
  CPC ........ H03M 3/38; G04F 10/005; H03L 7/087;
       H03L 7/0805; H03L 7/0812; H03L 7/085;
       H03L 7/099
  USPC ........................................ 341/120, 143, 155
  See application file for complete search history.

(56) References Cited

U.S. PATENT DOCUMENTS

| | | | |
|---|---|---|---|
| 6,356,129 B1* | 3/2002 | O'Brien | H03K 5/00006 |
| | | | 327/175 |
| 6,624,707 B1* | 9/2003 | Davis | H03L 7/0898 |
| | | | 327/156 |
| 6,928,128 B1* | 8/2005 | Sidiropoulos | H03K 5/133 |
| | | | 327/157 |
| 7,138,841 B1* | 11/2006 | Li | H03K 5/151 |
| | | | 327/175 |
| 8,018,259 B2* | 9/2011 | Sanchez | H03L 7/14 |
| | | | 327/159 |
| 9,722,590 B1 | 8/2017 | Usugi et al. | |
| 10,025,345 B2 | 7/2018 | Jeon et al. | |
| 10,343,433 B2 | 7/2019 | Liu et al. | |
| 10,833,665 B2* | 11/2020 | Jiang | H03K 5/1515 |
| 10,868,562 B1* | 12/2020 | Chou | G04F 10/005 |
| 2011/0181326 A1* | 7/2011 | Sanchez | H03L 7/14 |
| | | | 327/148 |
| 2018/0351769 A1* | 12/2018 | Tajalli | H03K 17/6871 |
| 2020/0186137 A1* | 6/2020 | Jiang | H03K 5/1515 |

\* cited by examiner

LOOP GAIN AUTO CALIBRATION USING LOOP GAIN DETECTOR

CROSS-REFERENCE TO RELATED APPLICATIONS

This application is a continuation of U.S. patent application Ser. No. 16/785,869, filed Feb. 10, 2020, all of which are incorporated herein by reference in its entireties.

FIELD

The technology described in this disclosure relates generally to electronic systems and more particularly to circuitry for auto calibration of a loop gain using a loop gain detector.

BACKGROUND

Loop gains can be used to analyze signal flow through a control system such as a circuit. Loop gains are mathematical representations of circuit behavior. A loop gain of 1 reflects that the control system is operating in an optimal state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
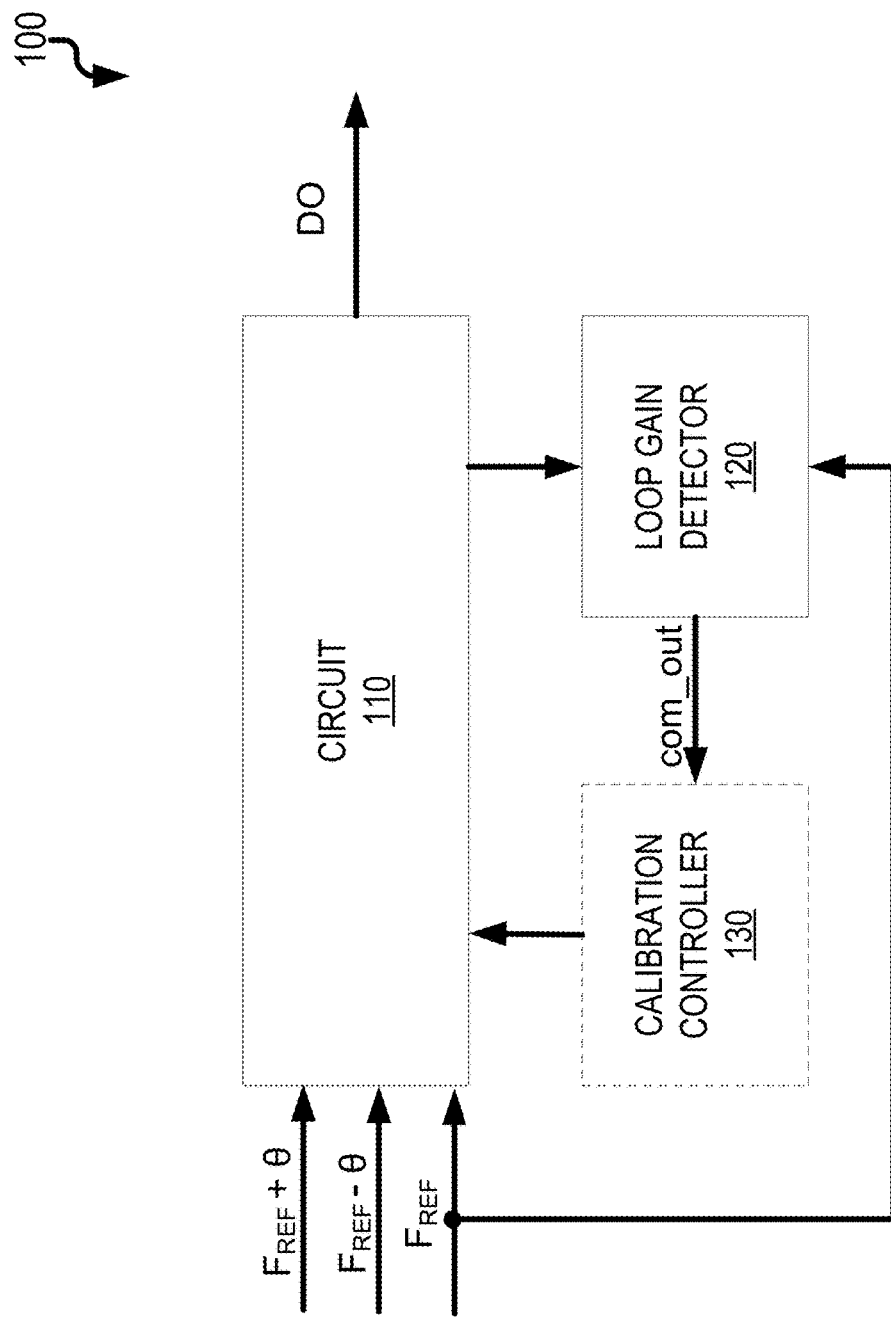
FIG. 1 illustrates an exemplary block diagram of a loop gain calibration system in accordance with various embodiments described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Determining of a loop gain of a control system in real-time can be difficult, requiring precise voltage measurements within specific timeframes (e.g., requiring pico-granularity). Manual detection of the loop gain can be difficult and time consuming. Additionally, modifying the control system appropriately to adjust the gain can require manual intervention. Use of a loop gain detector as described herein can provide an automatic measurement and appropriate adjustment of the loop gain.

FIG. 1 illustrates an exemplary block diagram of a loop gain calibration system 100 in accordance with various embodiments described herein. Loop gain calibration system 100 can include a circuit 110, a loop gain detector 120, and, in some embodiments, a calibration controller 130. Circuit 110 can be, in some embodiments, is a time-to-digital converter (TDC). TDCs are used in electrical devices to monitor for electrical events and output a digital representation of the corresponding time those events occur. TDCs can be used in a variety of applications, including detecting and/or measuring of noise with circuits having, for example, phase-locked loops (PLLs). The circuit 110 receives input signals such as a reference signal, Fref, and signals with various clock skews, Δθ, (e.g., Fref+θ, Fref−θ). The circuit 110 detects a phase difference between those signals in the time domain. That phase difference is converted by the circuit 110 to a digital output signal, DO (e.g., a logic low '0' or logic high '1'). A loop gain detector 120 is coupled to the circuit 110. Loop gain detector 120 can automatically detect a loop gain associated with the circuit 110. Based on the detected loop gain, loop gain detector 120 can generate an adjustment indicator (e.g., com_out) that is used by circuit 110 to adjust the loop gain. In some embodiments, a calibration controller 130 is coupled between the loop gain detector 120 and the circuit 110. The calibration control 130 can provide coarse and/or fine tune adjustment of the gain based on the adjustment indicator. In alternative embodiments, the adjustment indicator (e.g., com_out) can be provided to the circuit 110 to modify the loop gain.

Figure 2:
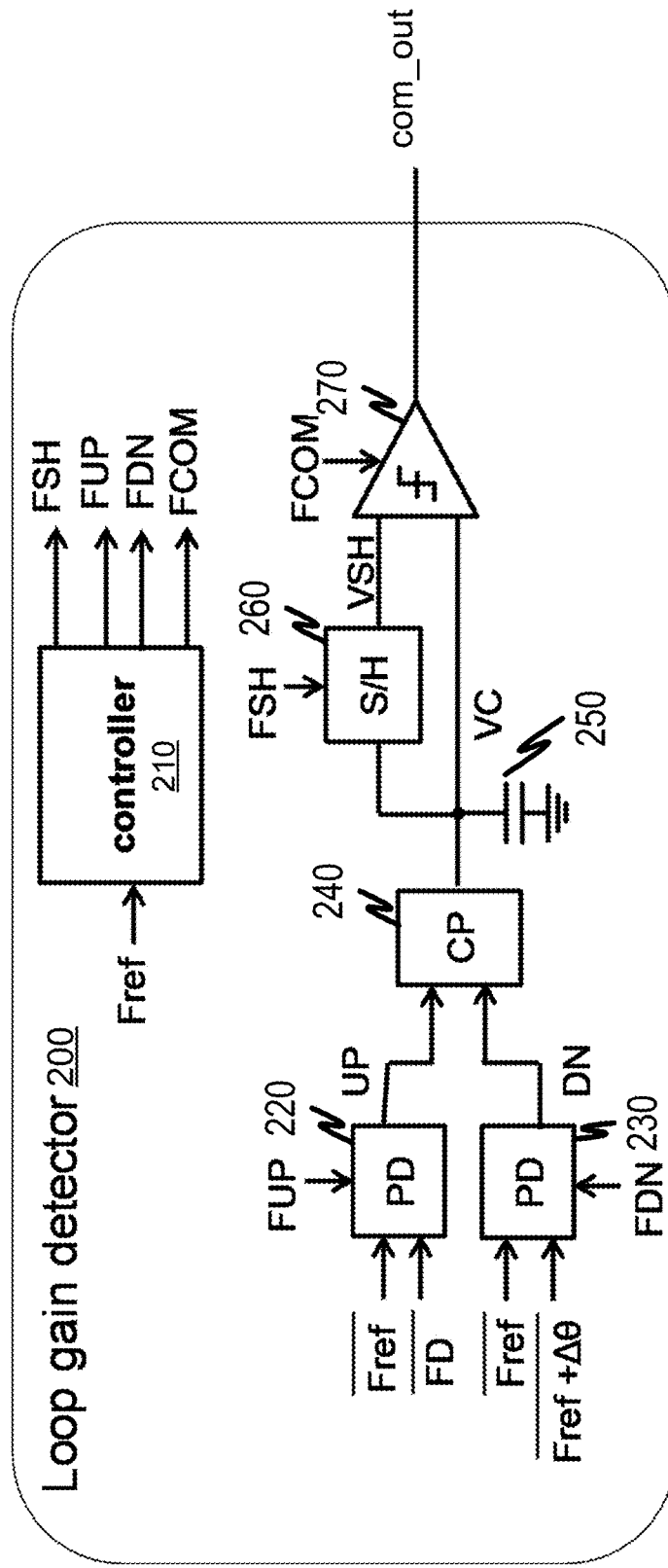
FIG. 2 illustrates an exemplary block diagram of a loop gain detector in accordance with various embodiments described herein.

FIG. 2 illustrates an exemplary block diagram of a loop gain detector 200 in accordance with various embodiments described herein. The loop gain detector 200 detects a loop gain of a circuit 110 that it is coupled to and outputs an indicator signal (e.g., com_out) back to that circuit 110. The indicator signal indicates whether the circuit 110 needs to be adjusted to either increase the gain or decrease the gain as described in more detail in FIG. 7. The indicator signal is a logic output. When the indicator signal is a logic high, the circuit 110 is adjusted to decrease the gain. When the indicator signal is a logic low, the circuit 110 is adjusted to increase the gain. Loop gain detector 200 includes a controller 210, at least two phase detectors (PD) 220, 230 a charge pump (CP) 240, a capacitor 250, a sample-and-hold component 260, and a comparator 270.

Controller 210 generates various control signals for controlling the PDs 220, 230 the sample-and-hold component 260, and the comparator 270. The controller 210 receives a reference signal, Fref. Using that reference signal, Fref, controller 210 generates a number of control signals including a S/H control signal for the S/H component 260 (e.g., FSH), a PD control signal for PD 220 (e.g., FUP), another PD control signal for PD 230 (e.g., FDN), and a comparator control signal for comparator 270 (e.g., FCOM). The PDs 220, 230 detect various phase errors or clock skews (e.g., $\Delta\theta$, $\Delta\alpha$, and $\Delta\beta$) and output an up signal (e.g., UP) and a down signal (e.g., DN), respectively. The CP 240 receives either the up signal or the down signal and translates the detected clock skew to a voltage variation, $\Delta V$, as described in more detail in FIG. 3.

The sample-and-hold (S/H) circuit 260 is a backup voltage keeper. The S/H circuit 260 operates when triggered by an input signal (e.g., FSH). When operating, the S/H circuit 260 samples the voltage of the loop at specified times and maintains and outputs that voltage, VSH, until the next sampling. In other words, when operating, the output voltage of S/H circuit 260 is equal to the voltage measured across capacitor 250 (e.g., VC). The comparator 270 compares a capacitor voltage, VC, and a previous voltage, VSH, sampled by the S/H circuit 260. With this comparison, the comparator 270 is detecting the loop gain of the system from which the input signal, FD, originated. The comparator 270 outputs an adjustment indicator (e.g., com_out) that reflects the loop gain of circuit 110. The loop gain signal can be used as an adjustment indicator. That loop gain signal is fed back to the circuit 110 as described in more detail in FIG. 7.

Figure 3:
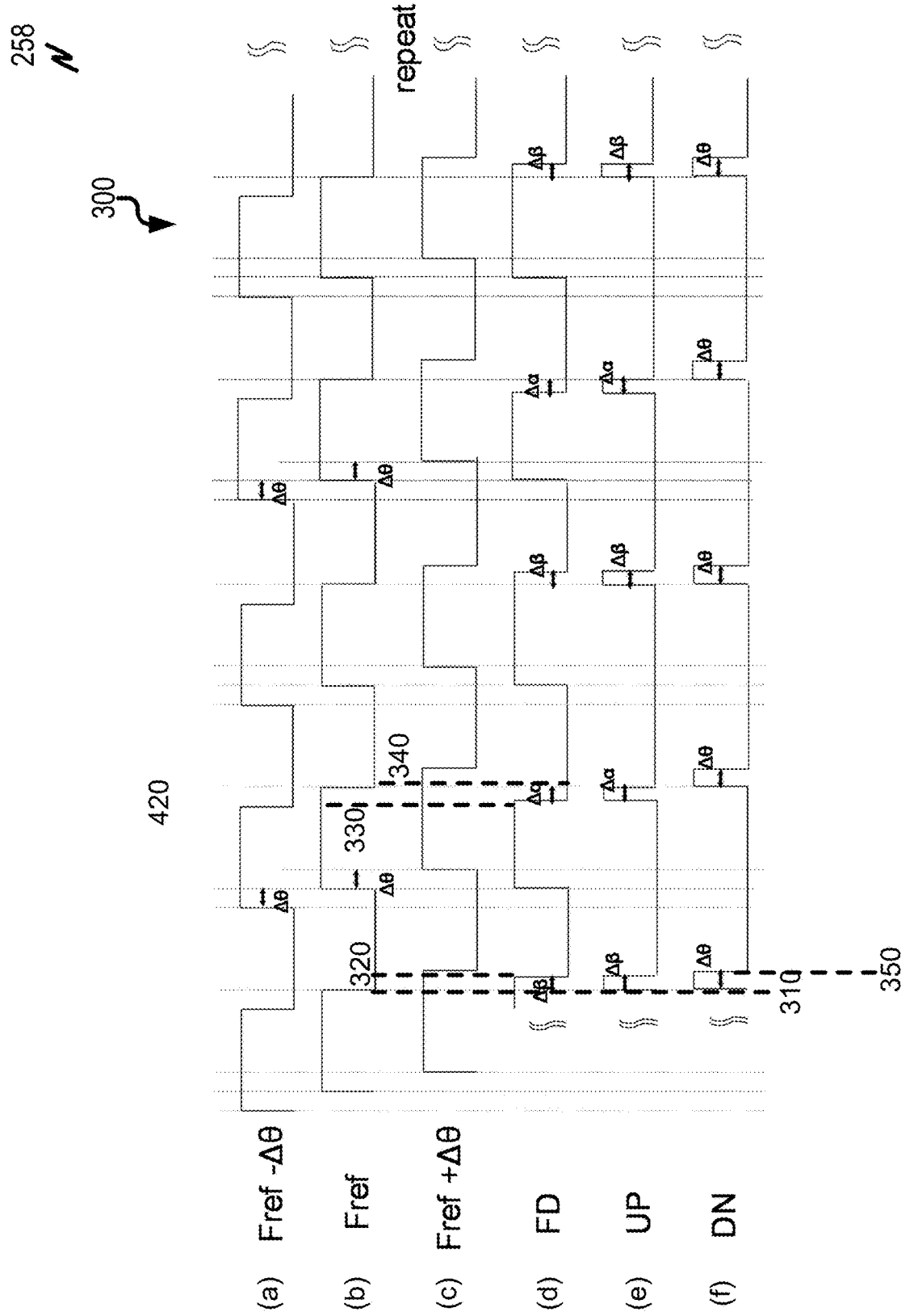
FIG. 3 illustrates an exemplary timing diagram of phase detector signals in accordance with various embodiments described herein.

FIG. 3 illustrates an exemplary timing diagram 300 of phase detector signals of phase detectors 220, 230 in accordance with various embodiments described herein. Timing diagram 300 includes a series of plots (a)-(f) illustrating various signals within phase detectors 220, 230. Plot (a) illustrates a reference signal negatively offset by a constant clock skew, Fref−θ. Plot (b) illustrates a reference signal, Fref. Plot (c) illustrates a reference signal positively offset by a constant clock skew, Fref+θ. Plot (d) illustrates an input signal, FD. Plot (e) illustrates an output signal from PD 220. Plot (f) illustrates an output signal from PD 230.

PD 220 is used to detect a falling edge (e.g., transition from a logic high to logic low) of a reference signal, Fref. PD 220 determines a clock skew associated with the falling edge by taking the difference between the reference signal, Fref, of plot (b) and the input signal, FD, of plot (d). By way of example, as illustrated in FIG. 3, falling edges of the reference signal, Fref, occur at points 310, 340. A clock skew of $\Delta\beta$ occurs when an input signal, FD, to PD 220 lags the reference signal, Fref. A signal is said to "lag" when it reaches its maximum peak after another signal reaches its maximum point. The clock skew of $\Delta\beta$ equals approximately the distance between a falling edge of the reference signal, Fref, at point 310 and a falling edge of the input signal, FD, at point 320. A clock skew of $\Delta\alpha$ occurs when an input signal, FD, to PD 220 leads the reference signal, Fref. A signal is said to "lead" when it reaches its maximum peak before another signal reaches its maximum peak. The clock skew of $\Delta\alpha$ equals approximately the distance between a falling edge of the input signal, FD, at point 330 and a falling edge of the reference signal, Fref at point 340. PD 220 detects these clock skews of $\Delta\beta$ or $\Delta\alpha$ and outputs a signal, UP, reflecting the detected clock skews. For example, as illustrated in plot (e), between points 310 and 320, a clock skew of $\Delta\beta$ is reflected. Similarly, between points 330 and 340, a clock skew of $\Delta\alpha$ is reflected in the signal, UP, of plot (e). The signal, UP, is provided to CP 240 to control its operation as described in more detail in FIG. 4.

PD 230 outputs a signal, DN, based on the difference between the reference signal, Fref, of plot (b) and a reference signal offset by a constant clock skew of $\Delta\theta$. Because this difference is a constant clock skew of $\Delta\theta$, the DN signal outputs $\Delta\theta$ between points 310 and 350 as illustrated in plot (f). The signal, DN, is provided to CP 240 to control its operation as described in more detail in FIG. 4.

Figure 4:
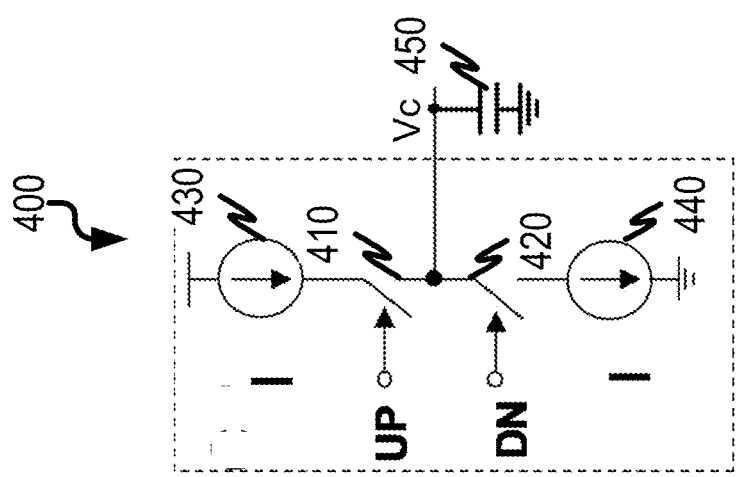
FIG. 4 illustrates an exemplary electrical schematic of a charge pump circuit in accordance with various embodiments described herein.

FIG. 4 illustrates an exemplary electrical schematic of a CP 400 in accordance with various embodiments described herein. CP 400 translates clock skews output by the PD 220, 230 into a voltage. The CP 400 can belong to a circuit 110 and/or a loop gain detector 200. When used in a loop gain detector 200, CP 400 is coupled between the PDs 220, 230 and the capacitor 250. CP 400 charges capacitor 450 when clock skews of $\Delta\alpha$ and/or $\Delta\beta$ are detected. CP 400 discharges capacitor 450 when a clock skew of $\Delta\theta$ is detected. CP 400 includes switches 410, 420 and current sources 430, 440. When a clock skew of $\Delta\alpha$ or $\Delta\beta$ is present in the signal, UP, from PD 220, switch 410 closes and current source 430 (e.g., I) drives current into capacitor 450. The presence of this current charges the capacitor 450. This in turn produces a voltage across capacitor 450, Vc. The amount of charge, $Q_{UP}$, due to the current driven by the signal, UP, can be expressed as follows:

$$Q_{UP} = I(\Delta\alpha) + I(\Delta\beta) \quad (1)$$

When a constant clock skew of $\Delta\theta$ is present in the signal, DN, from PD 220, switch 420 closes and current source 440 (e.g., I) reduces the current within capacitor 450. Such a reduction discharges the capacitor 450. The presence of this current also reduces the voltage across capacitor 450, Vc. The amount of discharge, $Q_{DN}$, due to the current driven by the signal, DN, can be expressed as follows:

$$Q_{DN} = I(\Delta\theta) \quad (2)$$

There may be times at which both clock skews of (i) $\Delta\alpha$ or $\Delta\beta$ and (ii) $\Delta\theta$ are present (e.g., such as between point 320 and point 350 in FIG. 3). Under these conditions, both switches 410 and 420 are closed. The voltage across capacitor 450 is maintained at a voltage level just prior to both switches 410 and 420 closing. This is because the rate of charge of the capacitor 450 is approximately equivalent to the rate of discharge. In other words, the following expression holds:

$$Q_{DN} = Q_{UP} \quad (3)$$

This will occur when the loop gain of a system coupled to the loop gain detector (e.g., system 100 of FIG. 1 or system 700 in FIG. 7) is equal to 1. When the loop gain of a system is equal to 1, the following expression also holds:

$$\Delta\alpha + \Delta\beta = \Delta\theta \quad (4)$$

Figure 5:
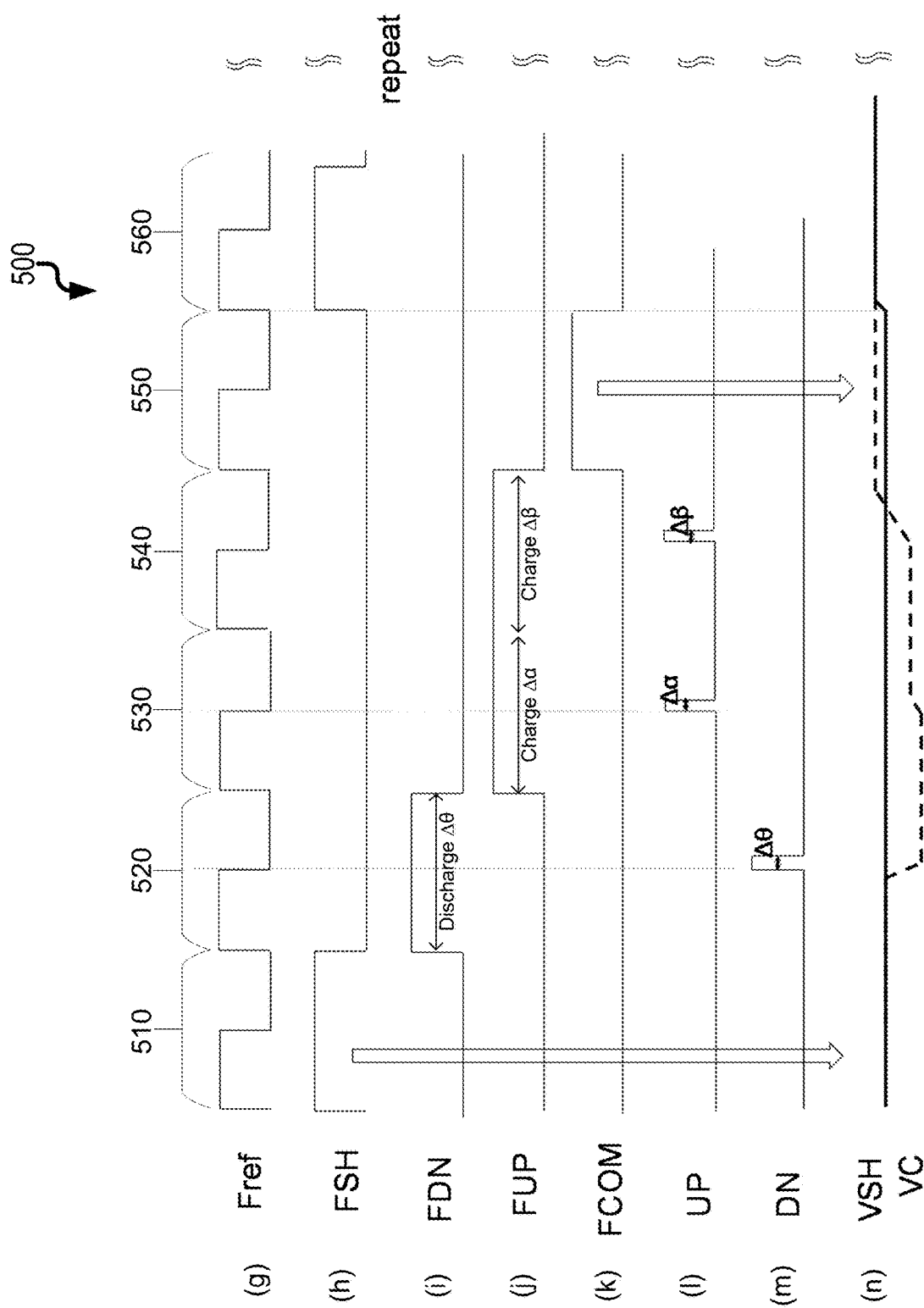
FIG. 5 illustrates an exemplary timing diagram of signals of an exemplary controller of loop gain detector and an exemplary loop gain detector in accordance with various embodiments described herein.

FIG. 5 illustrates an exemplary timing diagram 500 of controller 210 and loop gain detector 200 in accordance with various embodiments described herein. The controller 210 generates approximately four different control signals: a S/H control signal for the S/H component 260 (e.g., FSH), a PD control signal for PD 220 (e.g., FUP), another PD control signal for PD 230 (e.g., FDN), and a comparator control signal for comparator 270 (e.g., FCOM). Each of the control signals controls various operation of loop gain detector 200: the sample and hold operation, the discharge operation, the charge operation, and the compare operation. Plots (g)-(k) illustrate various signals associated with controller 210. Plot (g) illustrates the reference signal, Fref. Plot (h) illustrates the control signal for the sample and hold operation (e.g., FSH). Plot (i) illustrates the control signal for discharge operation (e.g., FDN). The control signal for the charge operation (e.g., FUP) is illustrated in plot (j). The compare operation control signal (e.g., FCOM) is illustrated in plot (k).

Plots (l)-(n) illustrates signals generated by loop gain detector 200. Plot (l) illustrates the output signal from PD 220, UP. Plot (m) illustrates the output signal from PD 230, DN. The voltage signals generated by capacitor 250, VC, and the S/H component 260 are illustrated in plot (n).

Each control signal is generated by controller 210 based on the reference signal, Fref. As illustrated in plot (g), the reference signal, Fref, iterates through a number of cycles (e.g., 510, 520, 530, 540, 550, 560). During each cycle, the reference signal, Fref, is a logic high (e.g., '1') for approximately half of the cycle and a logic low (e.g., '0') for approximately half of the cycle. During the first cycle 510, controller 210 generates a logic high for the control signal, FSH. When FSH is a logic high, the S/H component 260 operates. The operation of S/H component 260 samples its input voltage (e.g., the voltage of capacitor 250, VC). S/H component 260 outputs a voltage, VSH, equal to the voltage of the capacitor 250, VC, while sampling is occurring (as illustrated in plot (n) of FIG. 5). Sampling occurs for the entire duration of cycle 510 when the control signal FSH is a logic high. In this example, sampling ceases at the beginning of cycle 520 when controller 210 generates a logic low for the control signal FSH. The S/H component 260 maintains the last sampled voltage until the next sampling cycle. As illustrated in plot (n) by the solid line, the voltage level output by the S/H component 260, VSH, is maintained during cycle 510 through cycle 550. The controller 210 maintains a logic low of the control signal FSH until cycle 560. When cycle 560 begins, the controller 210 generates another logic high for control signal FSH and the sampling initiates again. During cycle 560, the S/H control signal, FSH, returns to a logic high. At that time, the voltage output by S/H component 260 increases to the same voltage held by the capacitor 250, VC, illustrated by the dashed line in plot (n).

After the first sample and hold operation, the capacitor 450 is discharged during cycle 520. In order to facilitate a discharge, as described in FIG. 4, a constant clock skew of $\Delta\theta$ needs to be detected, which triggers the closing of switch 420. The detection of $\Delta\theta$ occurs when PD 230 is operational. Control signal FDN controls the operation of PD 230. When the control signal FDN is a logic high, such as during cycle 520, PD 230 is operational. As described in FIG. 4, the discharge of capacitor 450 occurs when the constant clock skew of $\Delta\theta$ is detected (e.g., when the output signal of PD 230, DN, is a logic high). During cycle 520, a constant clock skew of $\Delta\theta$ is detected approximately half way into the cycle as shown in plot (m). A corresponding voltage drop across capacitor 450 (e.g., VC) when the constant clock skew of $\Delta\theta$ is detected occurs as illustrated in plot (n), where the dashed line is the capacitor voltage, VC, and the solid line is the voltage output by the S/H component 260. The operation of PD 230 is enabled by control signal, DN, for one cycle (e.g., cycle 520) of the reference signal, Fref.

During the next two cycles of the reference signal, Fref, (e.g., cycles 530, 540) the capacitor 450 is charged. The two cycles allows for two different clock skews (e.g., $\Delta\alpha$ and $\Delta\beta$) to be detected. The controller 210 generates a logic high for the control signal, FUP, that controls operation of PD 220 as illustrated in plot (j). When the control signal, FUP, is a logic high, PD 220 is operating. As discussed in detail in FIG. 4, the capacitor 450 is charged when switch 410 is closed. The closing of switch 410 is triggered when a clock skew of either $\Delta\alpha$ or $\Delta\beta$ is detected. Upon detection of either clock skew $\Delta\alpha$ or $\Delta\beta$, PD 220 generates an output signal reflecting that skew as illustrated in plot (l). When either clock skew $\Delta\alpha$ or $\Delta\beta$ is present, the switch 410 closes and the capacitor 450 is charged. The charging of capacitor 450 in turn increases the capacitor voltage, VC. As illustrated in plot (n), upon detection of a clock skew $\Delta\alpha$ in plot (l) during cycle 530, the capacitor voltage, VC, illustrated by the dotted line in plot (n) also increases. When the clock skew $\Delta\alpha$ is no longer detected (e.g., when the signal UP is a logic low), the voltage level of the capacitor, VC, is maintained. Upon detection of a clock skew $\Delta\beta$ during cycle 540, the capacitor 450 is also charged. This charging is illustrated by the increase in capacitor voltage, VC, of plot (n) during cycle 540.

Once the capacitor 450 is charged, the controller 210 can generated a logic high for the control signal of comparator 270, FCOM. With a logic high control signal, FCOM, comparator 270 is operational. As previously described in FIG. 2, comparator 270 compares the voltage levels between the capacitor voltage, VC, (e.g., the current capacitor voltage) and the S/H component voltage, VSH (e.g., the previous capacitor voltage). In other words, the comparator 270 evaluates the signal difference between the solid and dashed lines of plot (n). If the comparator voltage, VC, is less than the S/H component output voltage, VSH, then the following expression holds true:

$$\Delta\alpha+\Delta\beta<\Delta\theta. \quad (5)$$

The expression in Eq. (5) indicates that the loop gain needs to be decreased. The output of comparator 270 (e.g., com_out) is set to a logic high. If the comparator voltage, VC, is greater than the S/H component output voltage, VSH, then the following expression holds true:

$$\Delta\alpha+\Delta\beta>\Delta\theta. \quad (6)$$

The expression in Eq. (6) indicates that the loop gain needs to be increased. The output of comparator 270 (e.g., com_out) is set to a logic low. The loop gain adjustment continues until an ideal loop gain reflected by Eq. (4) is achieved.

Figure 6:
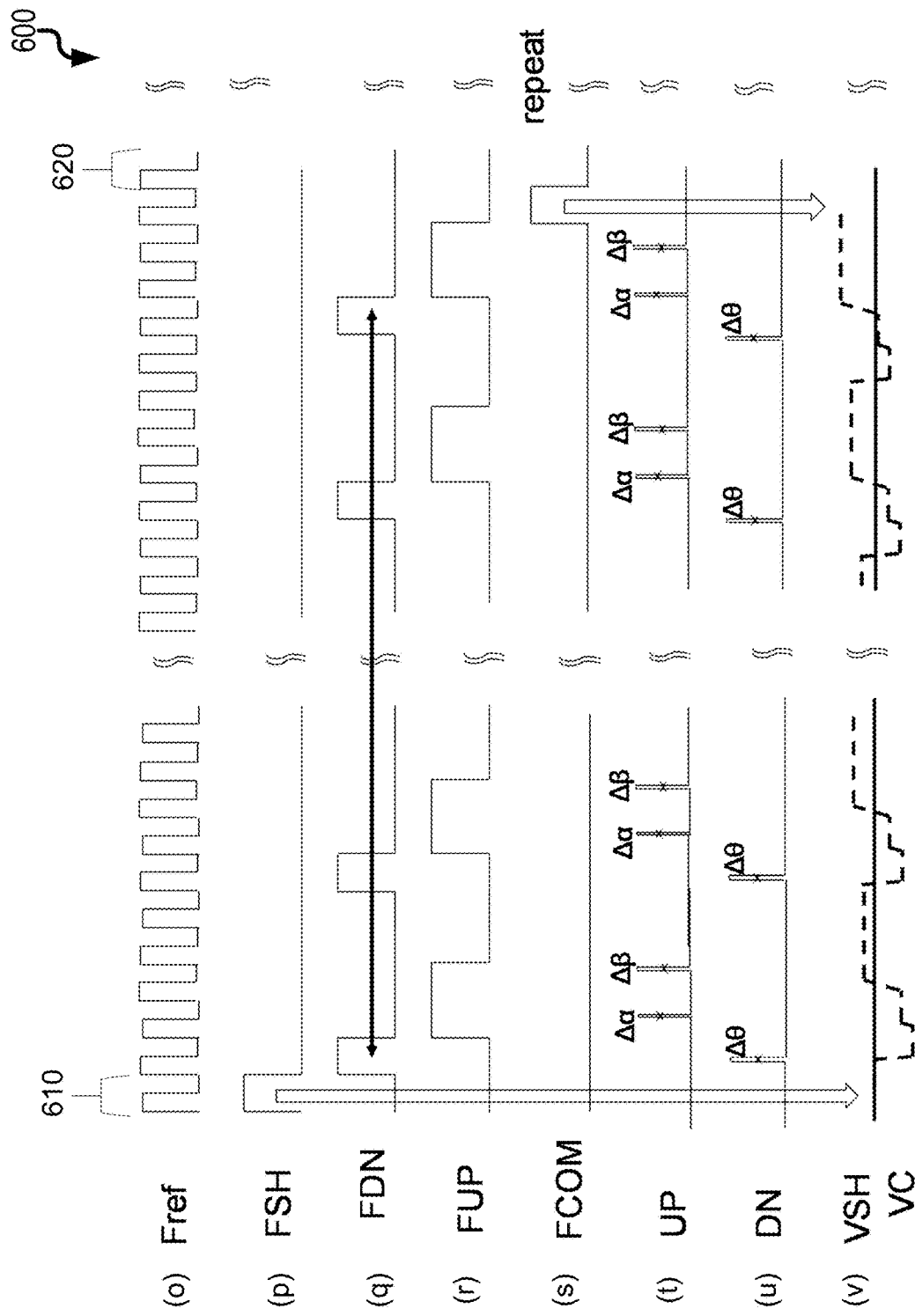
FIG. 6 illustrates another exemplary timing diagram of signals of loop gain detector in accordance with various embodiments described herein.

FIG. 6 illustrates another exemplary timing diagram 600 of loop gain detector 200 in accordance with various embodiments described herein. Plots (o)-(s) are similar to plots (g)-(k) described in FIG. 5. Plots (t)-(v) are similar to plots (l)-(n) described in FIG. 5. Under real operating conditions, the comparator 270 may not function as an ideal comparator. The voltage difference, $\Delta V$, between the capacitor voltage, VC, and the S/H component voltage, VSH, may be too small for comparator 270 to properly detect. In other words, the comparator 270 may fail to properly identify the voltage difference, $\Delta V$. In order to avoid a voltage difference, $\Delta V$, that is too small, the controller 210 in some embodiments can accumulate the capacitor 250 charges (e.g., $Q_{UP}$ and $Q_{DN}$) over a large number of cycles (e.g., 100-1000, 800-8000, 7000-17000 cycles). Controller 210 can be designed to adjust the $Q_{UP}$ and $Q_{DN}$ operating cycles to be more flexible. In this embodiment, the number of cycles of the reference signal, Fref, between cycle 610 and 620 can be a large number (e.g., 100-1000, 800-8000, 7000-17000 cycles).

Figure 7:
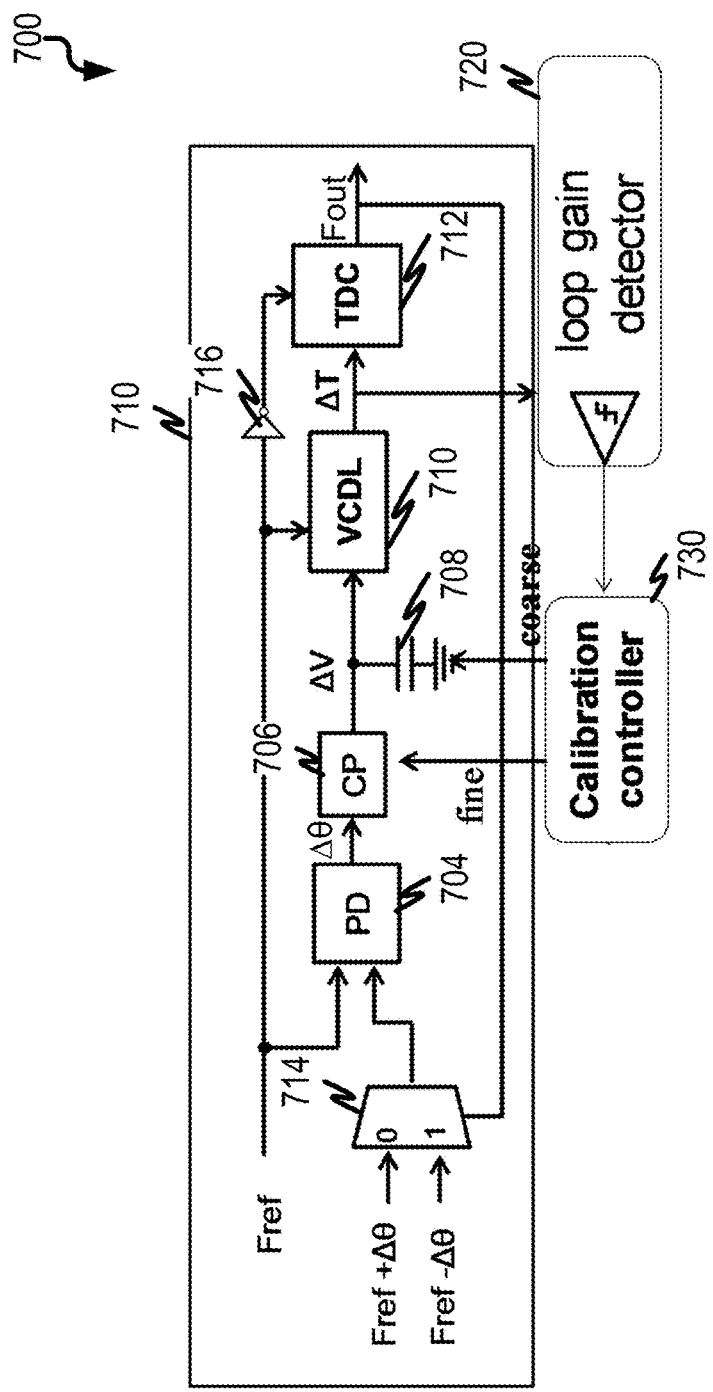
FIG. 7 illustrates an exemplary block diagram a loop gain calibration system in accordance with various embodiments described herein.

FIG. 7 illustrates an exemplary block diagram a loop gain calibration system 700 in accordance with various embodiments described herein. In this embodiment, circuit 110 is a delta sigma (ΔΣ) TDC. A ΔΣ TDC is a negative feedback control system that receives signals as input and outputs a digital representation of any phase difference (e.g., logical '0' or '1') between those signals. The loop gain calibration system 700 is an example of a first-order negative feedback system that utilizes loop gain detector 200.

In the embodiment illustrated in FIG. 7, the loop gain calibration system 700 includes a ΔΣ TDC 710, a loop gain detector 720, and an optional calibration controller 730. The loop gain detector 720 detects and adjusts accordingly a loop gain of ΔΣ TDC 710. The calibration controller 730 provides additional refinement of the loop gain through coarse tune 832 shown in FIG. 8, coarse lock 734, fine tune 836, and fine lock 838, each of which are described in more detail in FIG. 9. The ΔΣ TDC 710 includes a multiplexer 714, PD 704, CP 706, filter (capacitor) 708, a voltage controlled delay line (VCDL) 710, inverter 716, and a TDC 712. The multiplexer 714 receives a reference frequency signal, Fref, having various clock skews, Δθ. In some embodiments, the multiplexer 714 receives a first clock skewed signal, Fref−Δθ, at a first input of the MUX 714 and a second clock skewed signal, Fref+Δθ, at a second input of the MUX 714. The MUX 714 is triggered based on the output signal of TDC 712, $TDC_{out}$, which is fed back to MUX 714. The output of MUX 714 is either the first clock skewed signal, Fref−Δθ, or the second clock skewed signal, Fref+Δθ, depending upon the output signal of TDC 712, $TDC_{out}$.

The phase detector 704 detects a phase error, Δθ, between the reference signal, Fref, and an output of the MUX 714. The phase error, Δθ, is then provided to the CP 706. CP 706 generates a current, Icp, based on the phase error, Δθ, and then provides the current, Icp, to the capacitor 708. The CP 706 and capacitor 708 perform an integration function to convert the phase error, Δθ, to a tuning voltage, ΔV, proportional to the phase error, Δθ. The tuning voltage can be represented by the following expression:

$$\Delta V = \frac{\Delta \theta I_{CP}}{c} \qquad (7)$$

where C is the capacitance of capacitor 708. The tuning voltage, ΔV, is provided to a first input of the VCDL 710. A second input of the VCDL 710 is the reference voltage, Fref. The VCDL 710 determines a slope, $K_{VCDL}$, based on how much the VCDL 710 input phase leads the phase of the reference signal, Fref. The slope, $K_{VCDL}$, also reflects the number of input stages of the VCDL 710. In some embodiments, the slope, $K_{VCDL}$ is determined to ensure that the tuning voltage, ΔV, leads the reference signal, Fref, to reserve enough timing margin for VCDL 710 timing delay, ΔT. The VCDL 710 outputs the timing delay, ΔT, which is the input to TDC 712. The timing delay, ΔT, can be represented by the following expression:

$$\Delta T = \Delta V K_{VCDL} \qquad (8)$$

The VCDL 710 translates a voltage variance between the reference signal, Fref, and the timing delay, ΔT. $K_{VCDL}$ is the slope of timing delay, ΔT, and tuning voltage, ΔV, which is very sensitive to any variation. The loop gain detector 720 can monitor and measure the slope, $K_{VCDL}$. In various embodiments, depending on the structure of the VCDL 710, the timing delay, ΔT, can be proportional or inversely proportional to the magnitude of tuning voltage, ΔV.

The timing delay output of the VCDL 710, ΔT, is provided as a first input to the TDC 712 and the loop gain detector 720. In some embodiments, the TDC 712 can be one-bit. An inverted reference signal, -Fref, output from inverter 716 is provided as a second input to the TDC 712. The TDC 712 functions like a comparator in the time domain and compares the timing difference between timing delay, ΔT, and the inverted reference signal, -Fref. In some embodiments, the TDC 712 includes a D flip-flop, where the timing delay, ΔT, is input to the D input of the flip flop and the inverted reference signal, -Fref, is input to the clock input of the flip flop. In this embodiment, the TDC 712 detects any early or late information between the reference signal, Fref, and the timing delay, ΔT. In some embodiments, when the timing delay, ΔT, leads inverted reference signal, -Fref, the output of the TDC 712 is a logical high. When the timing delay, ΔT, lags inverted reference signal, ΔT, the output is a logical low.

Under ideal conditions, if the loop gain of the ΔΣ TDC 710 is equal to approximately 1, the following expression is true:

$$\frac{I_{CP}(\Delta \theta)}{c} K_{VCDL} = \Delta \theta = \Delta T \qquad (9)$$

which can be reduced to the following:

$$\frac{c}{I_{CP}} = K_{VCDL} \qquad (10)$$

Figure 8:
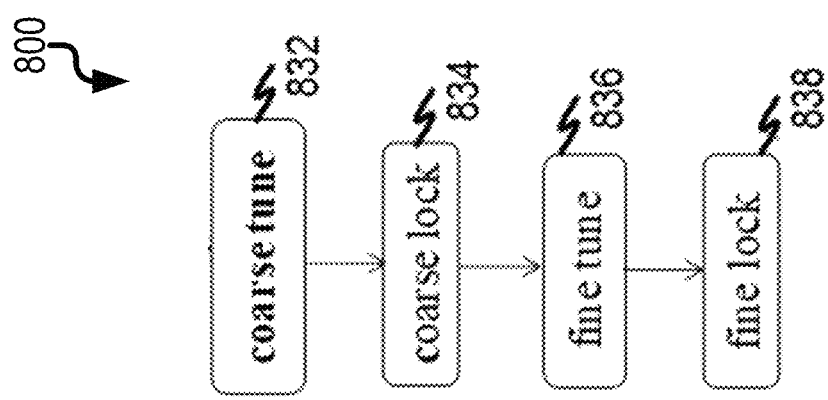
FIG. 8 illustrates an exemplary flow chart of the various tunings of calibration controller in accordance with various embodiments as described herein.
Figure 9:
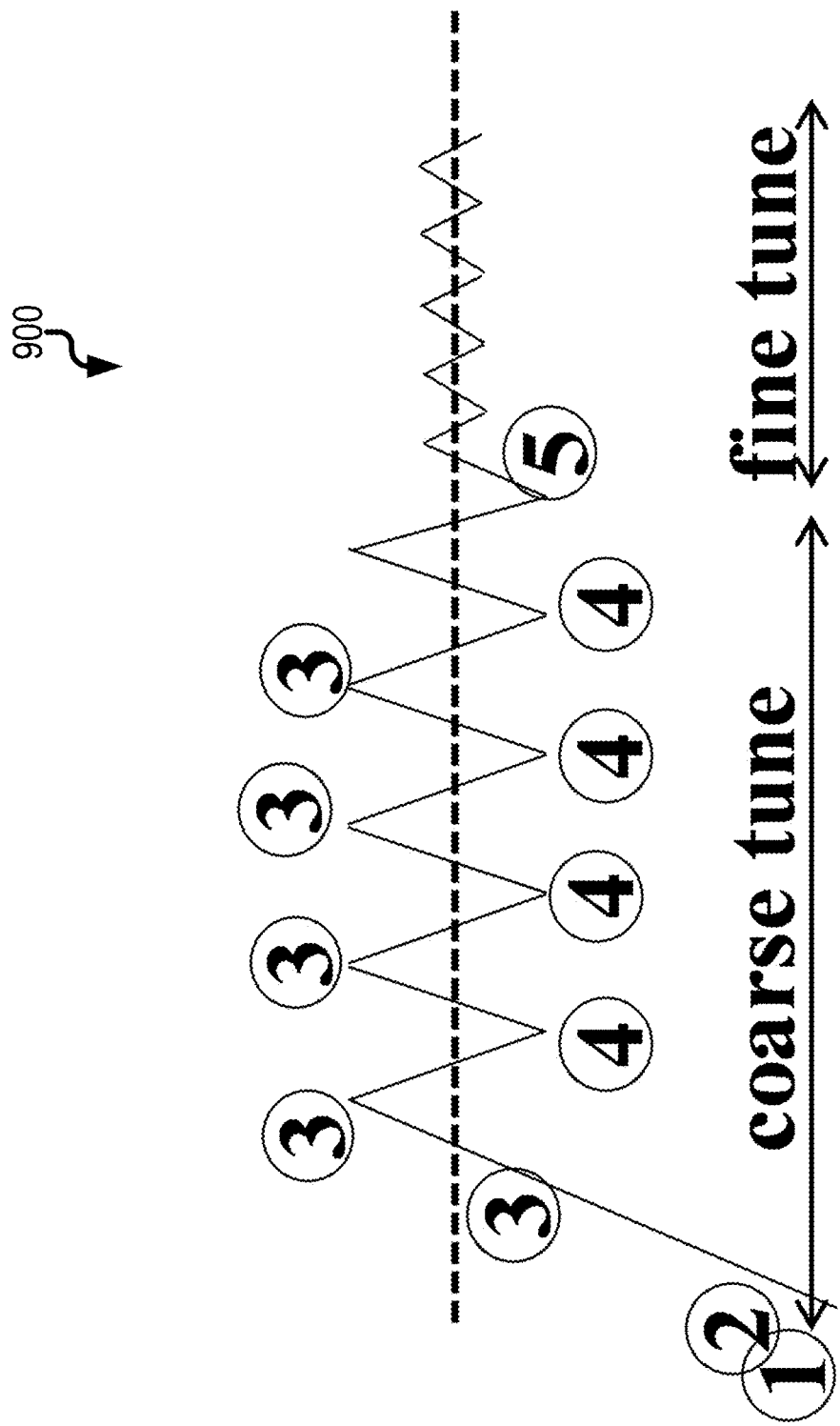
FIG. 9 illustrates an exemplary plot of tuning loop gains in accordance with various embodiments described herein.

FIG. 8 illustrates an exemplary flow chart 800 of the various tunings of calibration controller 730 (e.g., coarse tune 832, coarse lock 834, fine tune 836, and fine lock 838) in accordance with various embodiments as described herein. FIG. 9 illustrates an exemplary plot 900 of loop gain tuning in accordance with various embodiments described herein. The x-axis of plot 900 represents a target loop gain of approximately 1. The y-axis of plot 900 represents the actual loop gain of ΔΣ TDC 710. Coarse tuning 832 and coarse lock 834 operations occur during time points (1)-(4) illustrated in plot 900. Fine tuning 836 and fine lock 838 occur during time point (5) illustrated in plot 900. During coarse tuning 832, specific coarse tuning code within calibration controller 730 controls the loop filter capacitor values (e.g., capacitor 708). During fine tuning 836, specific fine tuning code within calibration controller 730 controls the charge pump current, $I_{CP}$, of CP 706.

Figure 10:
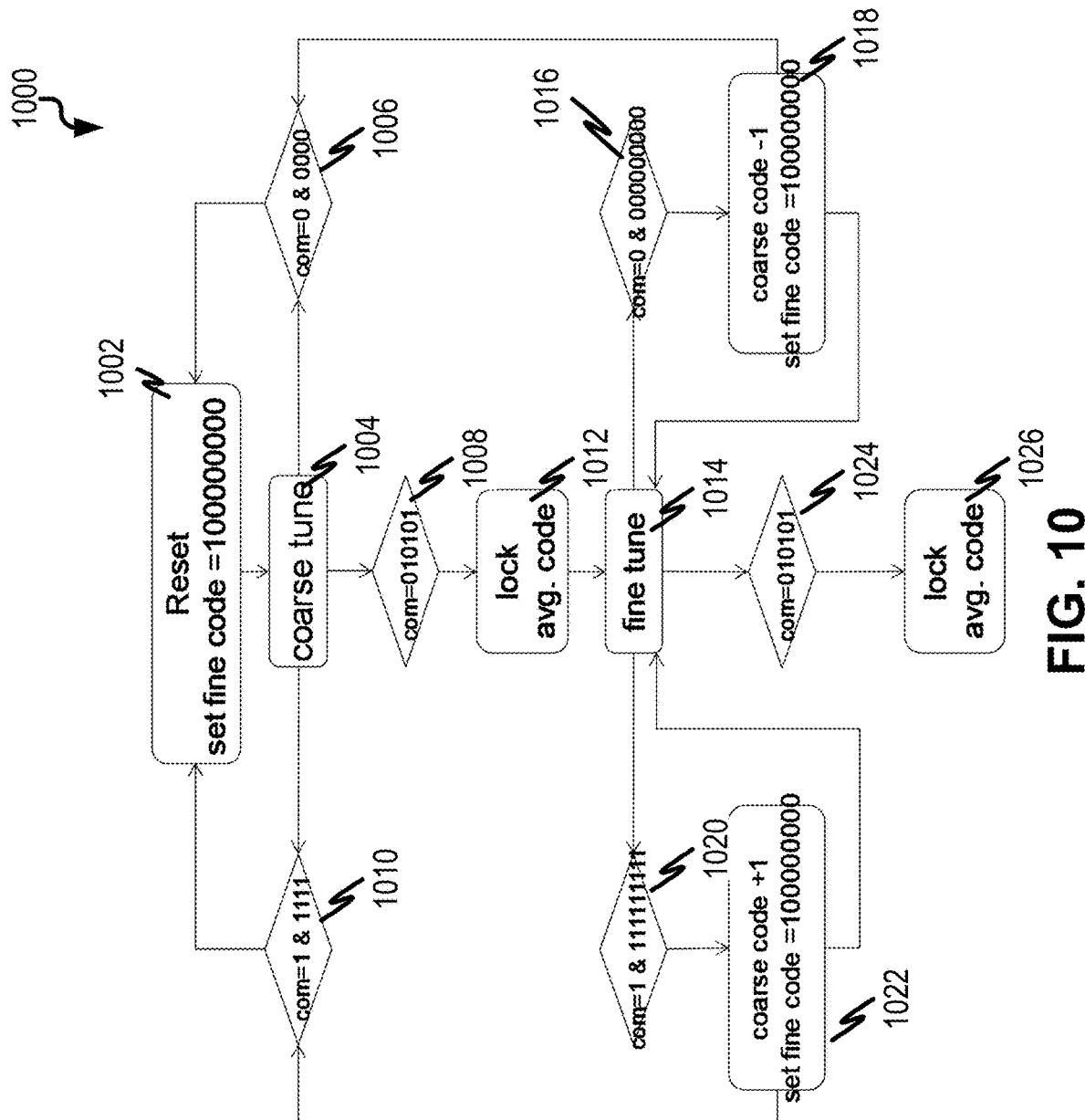
FIG. 10 illustrates an exemplary flow chart for operation of the calibration controller corresponding to plot of FIG. 9 in accordance with various embodiments described herein.

FIG. 10 illustrates an exemplary flow chart 1000 for operation of the calibration controller 730 corresponding to plot 900 of FIG. 9 in accordance with various embodiments described herein. Calibration controller 730 is used to adjust the slope, $K_{VCDL}$, as close as possible to the condition expressed by Eq. (10). For example, if the comparator output (e.g., com_out) is a logic high, then the calibration controller will adjust the coarse/fine tuning to decrease the loop gain. If the comparator output is a logic low, then the calibration controller will adjust the coarse/fine tuning to increase the loop gain. Initially, at time point (1) of plot 900, the fine tuning can be set to an initial fine tuning value, which in turn sets the current of the CP 706 (e.g., step 1002). The coarse tuning at time point (2) of plot 900 can be set to an initial coarse tuning value, which in turn sets the value of capacitor 708. The coarse tuning of various capacitance values of capacitor 708 can be continuously adjusted through increases and decreases, during the various time points (3)-(4) of plot 900, in an effort to achieve Eq. (10) (e.g., steps 1006, 1008, 1010). These adjustments are based on the outputs of the comparator within loop gain detector 720. When the comparator 708 output changes several times, then the loop gain is close to the target conditions of Eq. (10) and the coarse code is locked (e.g., step 1012). Fine tuning then initiates (e.g., step 1014). With fine tuning, the current of CP 706 is modified until the conditions of Eq. (10) are achieved (e.g., steps 1016, 1018, 1020, 1022). Once the conditions of Eq. (10) are achieved, then the fine tuning code is locked (e.g., step 1026).

Figure 11:
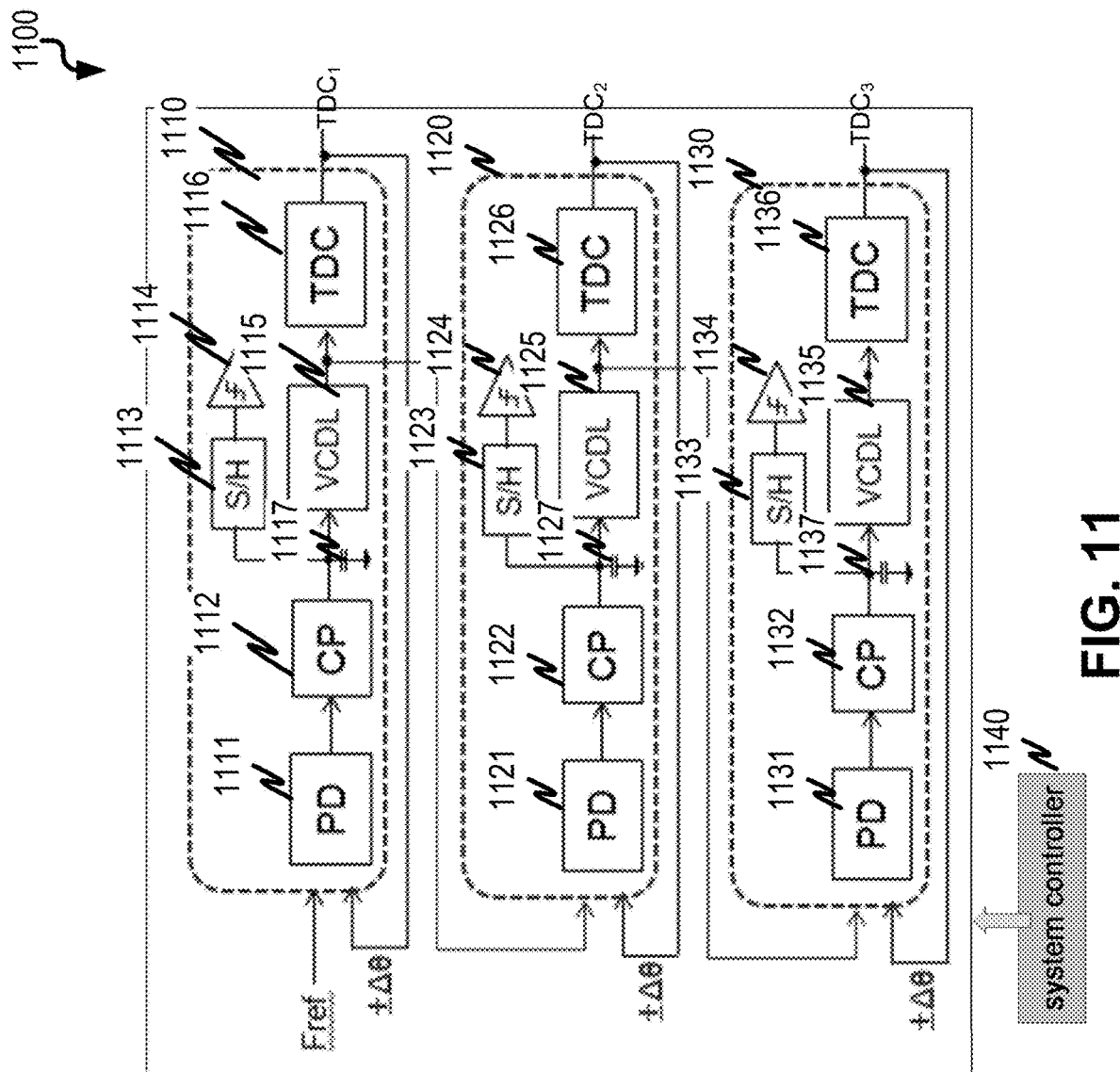
FIG. 11 illustrates an exemplary block diagram of a multi-staged loop gain calibration system in accordance with various embodiments described herein.

FIG. 11 illustrates an exemplary block diagram of a multi-staged loop gain calibration system 1100 in accordance with various embodiments described herein. Multi-stage loop gain calibration system 1100 includes a first ΔΣ TDC 1110, a second ΔΣ TDC 1120, a third ΔΣ TDC 1130, and a system controller 1140. The first ΔΣ TDC 1110 includes a PD 1111, a CP 1112, a S/H component 1113, a comparator 1114, a VCDL 1115, a TDC 1116, and a capacitor 1117. The second ΔΣ TDC 1120 includes a PD 1121, a CP 1122, a S/H component 1123, a comparator 1124, a VCDL 1125, a TDC 1126, and a capacitor 1127. The third ΔΣ TDC 1130 includes a PD 1131, a CP 1132, a S/H component 1133, a comparator 1134, a VCDL 1135, a TDC 1136, and a capacitor 1137. In this embodiment, components of the second ΔΣ TDC 1120 can be used for calibrating the first ΔΣ TDC 1110. In other words, some components of the second ΔΣ TDC 1120 form a loop gain detector for the first ΔΣ TDC 1110. More specifically, the output from VCDL 1115 is provided to the second ΔΣ TDC 1120 as input (e.g., the input signal, FD, to PD 1121). The PD 1121, the CP 1122, the S/H component 1123, the capacitor 1017, and the comparator 1124 form a loop gain detector and are used to calibrate the first ΔΣ TDC 1110.

Similarly, the third ΔΣ TDC 1130 can be used for the second ΔΣ TDC 1120. In other words, some components of the third ΔΣ TDC 1130 form a loop gain detector for the second ΔΣ TDC 1120. More specifically, the output from VCDL 1125 is provided to the third ΔΣ TDC 1130 as input (e.g., the input signal, FD, to PD 1131). The PD 1131, the CP 1132, the S/H component 1133, the capacitor 11

37, and the comparator 1134 provide calibration to the second ΔΣ TDC 1120. Because the embodiment illustrated in FIG. 11 is a three-stage multi-stage system, no additional ΔΣ TDCs are present to provide calibration of the third ΔΣ TDC 1130. Instead, system controller 1140 provides that calibration through software code. The use of multi-staged ΔΣ TDCs as loop gain detectors can reduce overall chip space as the components are re-used for calibration in addition for their intended purpose. In addition to saving chip space, the overall power usage is also lower. It is noted that while FIG. 11 describes three stages, such description is for ease of understanding. Any number of stages can be coupled together as described in FIG. 11 to achieve multi-stage calibration.

Figure 12:
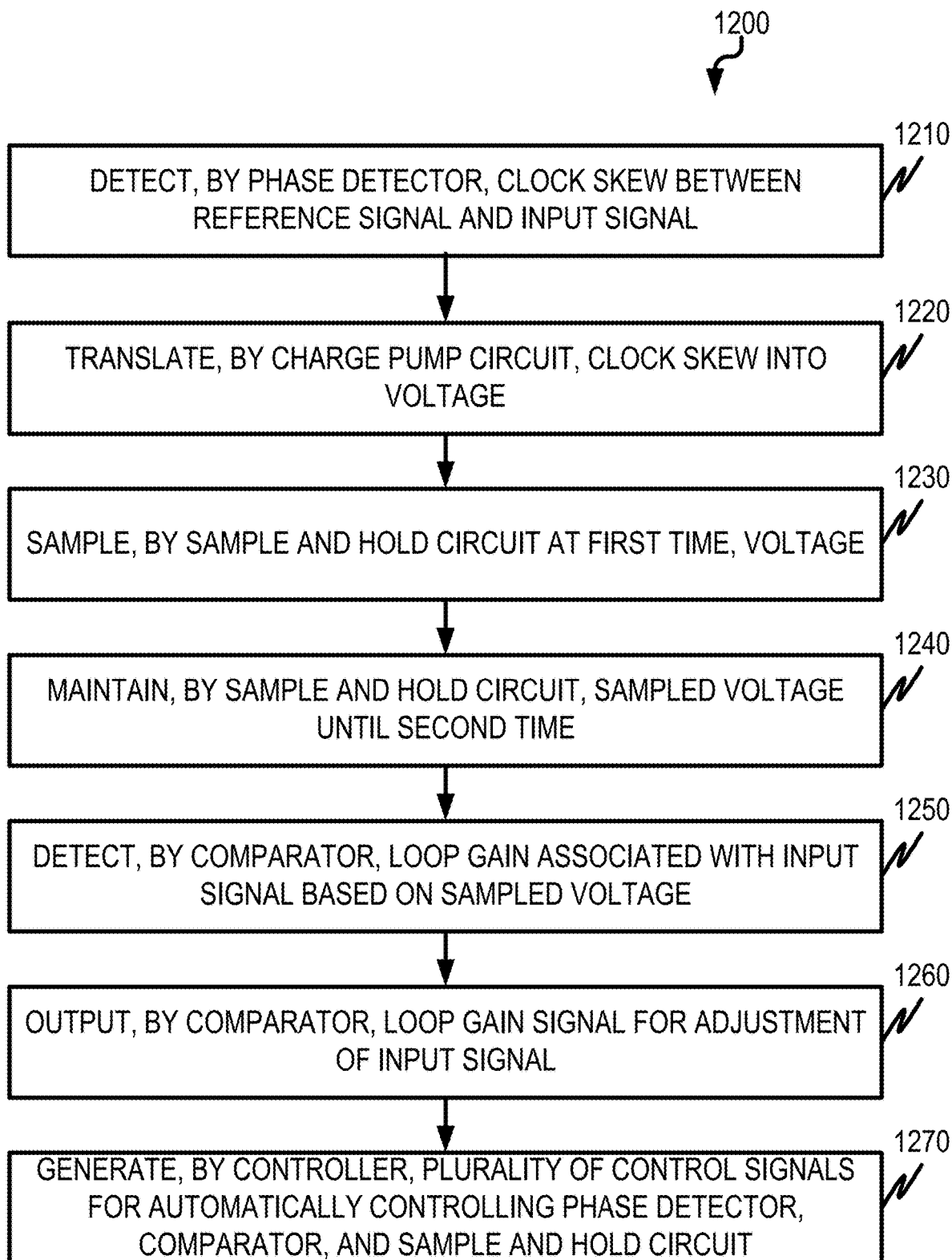
FIG. 12 illustrates a process flow diagram for loop gain auto calibration of a ΔΣ TDC delta sigma time-to-digital converter in accordance with various embodiments described herein.

FIG. 12 illustrates a process flow diagram 1200 for loop gain detection and automatic calibration in accordance with various embodiments described herein. A phase detector circuit detects a clock skew between a reference signal and an input signal (e.g., step 1210). A charge pump circuit translates the clock skew into a voltage (e.g., step 1220). A sample and hold circuit samples the voltage at a first time (e.g., step 1230). The sampled voltage is maintained by a sample and hold circuit until a second time (e.g., step 1240). The loop gain associated with the input signal is detected by a comparator based on the sampled voltage and the voltage (e.g., step 1250). A loop gain signal is output by the comparator for adjustment of the input signal (e.g., step 1260). A plurality of control signals are generated by the controller for automatically controlling operation of the phase detector, the comparator, and the sample and hold circuit (e.g., step 1270).

Use of the various circuits and configurations as described herein can provide a number of advantages. For example, the use of the loop gain detector described herein can provide for automatic detection of a slope, $K_{VCDL}$, and appropriate gain adjustment to achieve an ideal loop gain of approximately 1. The use of a multi-stage calibration system having two or more loop gain detectors coupled together can reduce overall power consumption of the loop gain detectors as well as reduce an overall chip area that the loop gain detectors occupy.

In one embodiment, a device includes a first phase detector circuit, a charge pump circuit, a sample and hold circuit, a comparator, and a controller. The first phase detector circuit is configured to detect a clock skew between a reference signal and an input signal. The charge pump circuit is configured to translate the clock skew into a voltage. A sample and hold circuit is configured to sample the voltage, at a first time, and maintain the sampled voltage until a second time. The comparator is configured to (i) detect a loop gain associated with the input signal based on the sampled voltage and the voltage at the second time and (ii) output a loop gain signal for adjustment of the input signal. The controller is coupled to the phase detector, the comparator, and the sample and hold circuit. The controller is configured to generate a plurality of control signals for automatically controlling operation of the phase detector, the comparator, and the sample and hold circuit.

In another embodiment, a system for automatic detection and calibration of a loop gain includes a first ΔΣ TDC and a first loop gain detector. The first ΔΣ TDC is configured to receive a reference signal. The first loop gain detector is coupled to the ΔΣ TDC and is configured to detect a loop gain of the ΔΣ TDC. The first loop gain detector includes a first phase detector circuit, a charge pump circuit, a sample and hold circuit, a comparator, and a controller. The first phase detector circuit is configured to detect a clock skew between the reference signal and a timing delay signal generated by the ΔΣ TDC. The charge pump circuit is configured to translate the clock skew into a voltage. The sample and hold circuit is configured to sample the voltage, at a first time, and maintain the sampled voltage until a second time. The comparator is configured to (i) detect the loop gain of the ΔΣ TDC based on the sampled voltage and the voltage and (ii) provide a loop gain signal to the ΔΣ TDC for adjustment of the timing delay signal. The controller is coupled to the first phase detector, the comparator, and the sample and hold circuit and configured to generate a plurality of control signals for automatically controlling operation of the first phase detector, the comparator, and the sample and hold circuit.

A method for automatic detection and calibration of a loop gain includes detecting, by a phase detector circuit, a clock skew between a reference signal and an input signal. A charge pump circuit translates the clock skew into a voltage. A sample and hold circuit samples the voltage at a first time. The sample and hold component maintains the sampled voltage until a second time. The comparator detects the loop gain associated with the input signal based on the sampled voltage and the voltage. The comparator outputs a loop gain signal for adjustment of the input signal. The controller generates a plurality of control signals for automatically controlling operation of the phase detector, the comparator, and the sample and hold circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first phase detector circuit configured to detect a clock skew between a reference signal and an input signal;
   a charge pump circuit configured to translate the clock skew into a voltage;
   a sample and hold circuit configured to sample the voltage and maintain the sampled voltage; and
   a comparator configured to detect a loop gain associated with the input signal based on the sampled voltage and the voltage and output a loop gain signal for adjustment of the input signal.

2. The device of claim 1, further comprising a controller to the first phase detector, the comparator, and the sample and hold circuit, the controller configured to generate a plurality of control signals for automatically controlling operation of the phase detector, the comparator, and the sample and hold circuit, wherein the reference signal comprises a plurality of cycles and the plurality of control signals comprise:
   a sample and hold circuit control signal configured to operate the sample and hold circuit during a first cycle of the plurality of cycles;
   a first phase detector control signal configured to operate the first phase detector during a second cycle and a third cycle of the plurality of cycles;
   a second phase detector control signal configured to operate a second phase detector during a fourth cycle of the plurality of cycles; and
   a comparator control signal configured to operate the comparator during a fifth cycle of the plurality of cycle.

3. The device of claim 2, wherein the controller is further configured to automatically adjust one or more control signals of the plurality of control signals based on the loop gain.

4. The device of claim 1, further comprising a capacitor coupled between the sample and hold circuit and the charge pump circuit, wherein the voltage is across the capacitor.

5. The device of claim 4, wherein the charge pump circuit comprises:
   a first switch configured to close based on detection of the clock skew; and
   a second switch configured to close based on detection of a constant clock skew.

6. The device of claim 5, wherein (i) closing of the first switch charges the capacitor and increases the voltage, (ii) closing of the second switch discharges the capacitor and decreases the voltage, and (iii) closing of both the first switch and the second switch simultaneously maintains a charge of the capacitor and maintains the voltage.

7. The device of claim 5, further comprising the second phase detector configured to detect the constant clock skew, the controller being coupled to the second phase detector.

8. The device of claim 1, wherein the clock skew indicates that either (i) the reference signal leads the input signal or (ii) the reference signal lags the input signal.

9. A system comprising:
   a first delta sigma time-to-digital converter ($\Delta\Sigma$ TDC) configured to receive a reference signal; and
   a loop gain detector coupled to the first $\Delta\Sigma$ TDC configured to detect a loop gain of the first $\Delta\Sigma$ TDC, the loop gain detector comprising:
   a first phase detector circuit configured to detect a clock skew between the reference signal and a timing delay signal generated by the first $\Delta\Sigma$ TDC;
   a charge pump circuit configured to translate the clock skew into a voltage;
   a sample and hold circuit configured to sample the voltage and maintain the sampled voltage; and
   a comparator configured to detect the loop gain of the first $\Delta\Sigma$ TDC based on the sampled voltage and the voltage and provide a loop gain signal to the first $\Delta\Sigma$ TDC for adjustment of the timing delay signal.

10. The system of claim 9, wherein the first $\Delta\Sigma$ TDC and the loop gain detector coupled together form a first-order negative feedback loop.

11. The system of claim 9, further comprising a controller coupled to the first phase detector, the comparator, and the sample and hold circuit, the controller configured to generate a plurality of control signals for automatically controlling operation of the first phase detector, the comparator, and the sample and hold circuit, wherein the reference signal comprises a plurality of cycles and the plurality of control signals comprise:
   a sample and hold circuit control signal configured to operate the sample and hold circuit during a first cycle of the plurality of cycles;
   a first phase detector control signal configured to operate the first phase detector during a second cycle and a third cycle of the plurality of cycles;
   a second phase detector control signal configured to operate a second phase detector during a fourth cycle of the plurality of cycles; and
   a comparator control signal configured to operate the comparator during a fifth cycle of the plurality of cycle.

12. The system of claim 11, wherein the controller is further configured to automatically adjust one or more control signals of the plurality of control signals based on the loop gain.

13. The system of claim 9, wherein the loop gain detector further comprises a capacitor coupled between the sample and hold circuit and the charge pump circuit, wherein the voltage is across the capacitor.

14. The system of claim 13, wherein the charge pump circuit comprises:
   a first switch configured to close based on detection of the clock skew; and
   a second switch configured to close based on detection of a constant clock skew.

15. The system of claim 14, wherein (i) closing of the first switch charges the capacitor and increases the voltage, (ii)

closing of the second switch discharges the capacitor and decreases the voltage, and (iii) closing of both the first switch and the second switch simultaneously maintains a charge of the capacitor and maintains the voltage.

16. The system of claim 14, wherein the loop gain detector further comprises a second phase detector configured to detect the constant clock skew, the controller being coupled to the second phase detector.

17. The system of claim 9, wherein the clock skew indicates that either (i) the reference signal leads the input signal or (ii) the reference signal lags the input signal.

18. The system of claim 9, further comprising a second $\Delta\Sigma$ TDC comprising the first phase detector, the charge pump circuit, the sample and hold component, and the comparator.

19. The system of claim 9, further comprising a calibration circuit coupled between the loop gain detector and the first $\Delta\Sigma$ TDC, wherein the calibration circuit is configured to provide at least one of (i) coarse tuning of a current of the charge pump circuit or (ii) fine tuning of a capacitor of the first $\Delta\Sigma$ TDC.

20. A method comprising:
    detecting, by a phase detector circuit, a clock skew between a reference signal and an input signal;
    translating, by a charge pump circuit, the clock skew into a voltage;
    sampling, by a sample and hold circuit, the voltage;
    maintaining, by the sample and hold circuit, the sampled voltage;
    detecting, by a comparator, the loop gain associated with the input signal based on the sampled voltage and the voltage; and
    outputting, by the comparator, a loop gain signal for adjustment of the input signal.

* * * * *